(12) United States Patent
Gallo et al.

(10) Patent No.: US 8,847,191 B1
(45) Date of Patent: Sep. 30, 2014

(54) PROGRAMMABLE IMPEDANCE MEMORY ELEMENTS, METHODS OF MANUFACTURE, AND MEMORY DEVICES CONTAINING THE SAME

(75) Inventors: Antonio R. Gallo, San Mateo, CA (US); Foroozan Sarah Koushan, San Jose, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/431,951

(22) Filed: Mar. 27, 2012

(51) Int. Cl.
*H01L 47/00* (2006.01)

(52) U.S. Cl.
USPC ................ 257/4; 257/2; 257/3; 365/158

(58) Field of Classification Search
USPC .......................... 257/1–4; 365/148
See application file for complete search history.

(56) References Cited

U.S. PATENT DOCUMENTS

| 5,761,115 | A | 6/1998 | Kozicki |
| 6,418,049 | B1 | 7/2002 | Kozicki et al. |
| 6,635,914 | B2 | 10/2003 | Kozicki et al. |
| 8,084,760 | B2 | 12/2011 | Lung et al. |
| 2009/0096568 | A1 | 4/2009 | Hosoi et al. |
| 2010/0252798 | A1 | 10/2010 | Sumino |

*Primary Examiner* — Matthew W Such
*Assistant Examiner* — Frederick B Hargrove

(57) ABSTRACT

A memory device can include a plurality of memory elements, each including first electrode having a surrounding first electrode side surface in a lateral direction; a memory material surrounding the first electrode side surface in the lateral direction, the memory material being programmable between at least two different impedance states in response to electric fields; and a second electrode formed around the memory material in the lateral direction.

15 Claims, 8 Drawing Sheets

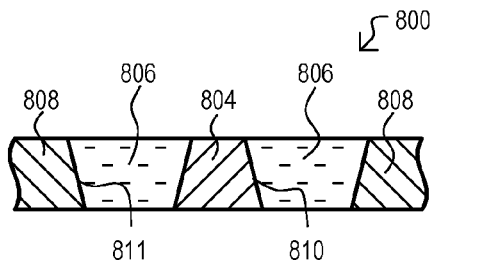
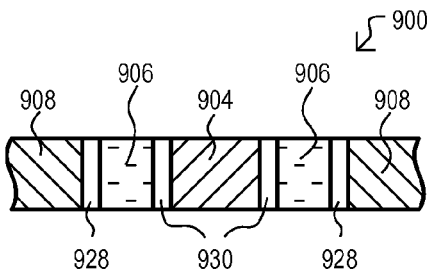
FIG. 8  FIG. 9
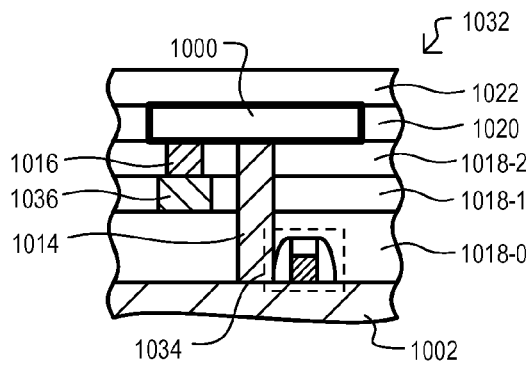
FIG. 10
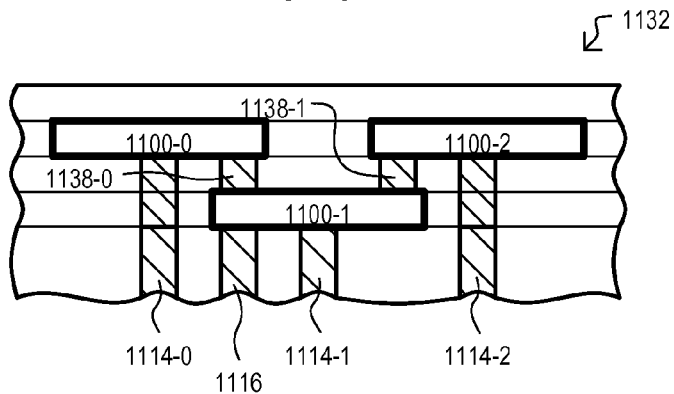
FIG. 11
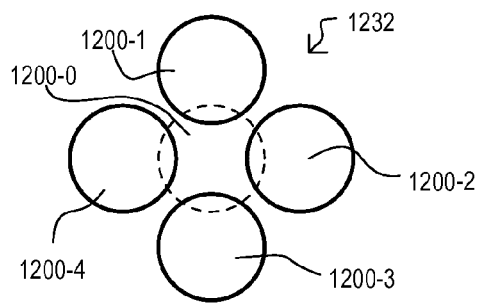
FIG. 12

(BACKGROUND)

PROGRAMMABLE IMPEDANCE MEMORY ELEMENTS, METHODS OF MANUFACTURE, AND MEMORY DEVICES CONTAINING THE SAME

TECHNICAL FIELD

The present disclosure relates generally to memory devices, and more particularly to memory elements that can be included in memory devices having a programmable impedance layer for storing data values.

BACKGROUND

FIG. 18 shows a conventional conductive bridging random access memory (CBRAM) type memory element 1800, also sometimes called a programmable metallization cell (PMC). Memory element 1800 has a vertical stack, including a cathode 1803, an ion conducting layer 1805, an anode 1807, and a top contact 1809. A cathode 1803 can be formed in a first insulating layer 1811, and is made of an "inert" conductive material that does not ion conduct in ion conducting layer 1805.

An anode 1807 can be made of an "active" metal that ion conducts in ion conducting layer 1805. In the conventional example shown, an anode 1807 can be formed of silver (Ag).

Ion conducting layer 1805 can be formed between the anode 1807 and cathode 1803, contacting the cathode 1803 through an opening in second insulating layer 1813. By application of a bias voltage across anode 1807 and cathode 1803, a metal within anode 1807 can ion conduct within layer 1805 to thereby create (or dissolve) a conductive path (e.g., a filament). The presence of the conductive path can represent one data state (a low resistance state). The absence of the conductive path can represent another data state (a high resistance state). In the conventional example shown, ion conducting layer 1805 can be formed of the chalcogenide $GeS_2$.

An anode 1807 can be biased to a voltage by way of top electrode 1809.

One possible drawback to a conventional memory element like that of FIG. 18 can be mechanical stresses that can arise during temperature changes. In particular, there can be a substantial difference between the thermal coefficient of expansion of the anode 1807 (i.e., silver) and other section of an integrated circuit (i.e., silicon). Accordingly, changes in temperature can impart mechanical stress on the device.

Another possible drawback of a conventional memory element like that of FIG. 18 can be the unconstrained movement of anode material. Upon dissolution of filaments, atoms making such filaments may not return uniformly to anode 1807.

BRIEF DESCRIPTION OF THE DRAWINGS

FIG. 8 is a side cross sectional view of a memory element according to another embodiment.
FIG. 9 is a side cross sectional view of a memory element according to another embodiment.
FIG. 10 is a side cross sectional view of a memory device according to an embodiment.
FIG. 11 is a side cross sectional view of a memory device according to another embodiment.
FIG. 12 is a top plan view of a memory device like that of FIG. 11.

DETAILED DESCRIPTION

Figure 1:
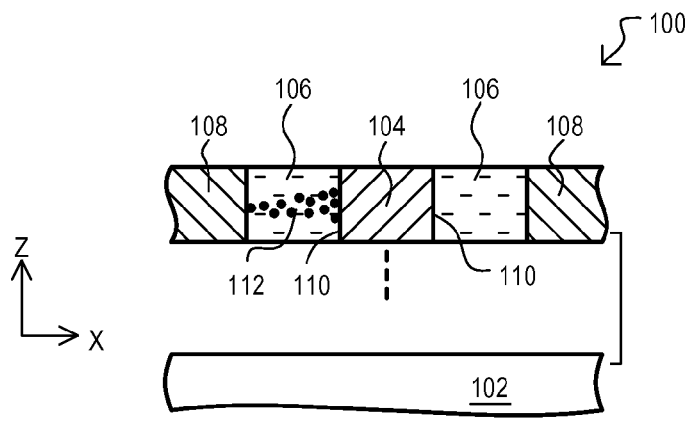
FIG. 1 is a side cross sectional view of a memory element according to an embodiment.

Embodiments disclosed herein show memory elements that can store data based on changes in impedance. In particular embodiments, a memory element can include a relatively small, centralized first electrode surrounded by a memory material and a second electrode in a lateral direction.

In the various embodiments shown below, like items can be referred to by the same reference character but with the leading digit(s) corresponding to the figure number.

Referring to FIG. 1, a memory element 100 according to an embodiment is shown in a side cross sectional view. A memory element 100 can be included as one of many memory elements in a memory device.

Figure 18:
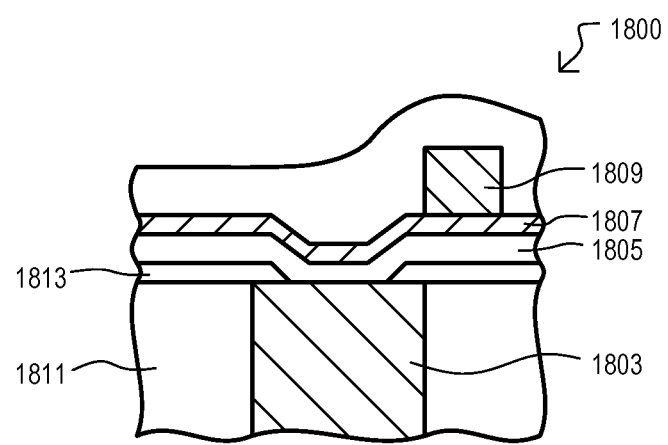
FIG. 18 is a side cross sectional view of a conventional conductive bridging random access memory (CBRAM) type element according to an embodiment.

A memory element 100 can be formed over a substrate 102, and unlike the embodiment of FIG. 18, can have a lateral structure. More particularly, a memory element 100 can extend in a lateral direction (shown as X), which can be parallel to a surface of substrate 102. This is in contrast to the conventional example of FIG. 18, which has a vertical orientation. In very particular embodiments, a substrate 102 can be an integrated circuit substrate formed from a semiconductor material, such as silicon, as but one example.

A memory element 100 can include a first electrode 104, a memory material 106, and a second electrode 108. A first electrode 104 can have a surrounding side surface 110. Surface 110 can define the limits of the first electrode 104 in the lateral direction.

A memory material 106 can surround first electrode 104 in the lateral direction. A memory material 106 can be a material that can be reversibly programmed between different impedance states in response to an applied electric field. In the embodiment shown, a memory material 106 can be formed in contact with side surface 110 of first electrode 104.

A second electrode 108 can surround memory material 106 in the lateral direction. In the embodiment shown, a second electrode 108 can be formed in contact with memory material 106.

In one embodiment, by application of a voltage between first and second electrodes (104 and 108), an impedance (e.g., resistance, capacitance) of memory material 106 can be changed, to thereby program memory element 100 between two or more different values.

In a particular embodiment, a memory layer 106 can include an ion conductor, and a first electrode 104 can be an anode that includes one or more elements that can ion conduct through memory layer 106. A second electrode 108 can be a cathode, formed from materials that do not substantially ion conduct within memory layer 106. FIG. 1 shows a representation of a conductive filament 112 that can be formed in such an embodiment. By application of a voltage of one polarity applied between anode (104) and cathode (106), mobile ions can form a filament 112.

It is understood that the application of a reverse polarity can result in conductive filament dissolving, with some or all of the atoms making up the filament, ionizing and returning to the anode.

In a very particular embodiment, a memory layer 106 can be an ion conductor that includes any of: a chalcogenide or a metal oxide. A first electrode 104 can include any of: silver or copper. A second electrode 108 can include any of: tungsten, titanium, or titanium nitride.

Figure 2:
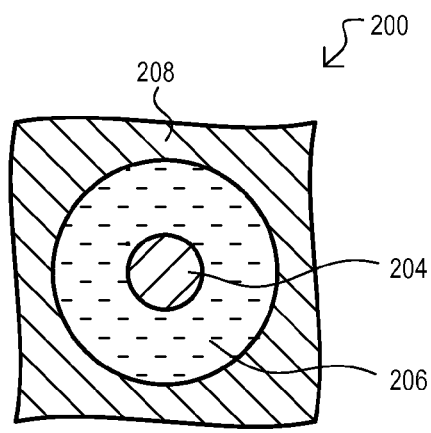
FIG. 2 is a top plan view of a memory element according to an embodiment.

FIG. 2 shows a top plan view of a memory element 200 according to an embodiment. In one very particular embodiment, a memory element 200 can be one implementation of that shown in FIG. 1. Memory element 200 can include a first electrode 204 surrounded by memory material 206 in a lateral direction. Memory material 206 can be surrounded by a second electrode 208 in the lateral direction.

In some embodiments, a first electrode 204 can be an anode and memory material 206 can include an ion conducting material. In such an arrangement, a memory element 200 can provide full field control over the entire memory material 206, as the cathode (second electrode 208) completely surrounds the ion conductor (memory material 206) and anode (first electrode 204). Such an arrangement can apply a uniform electric field throughout the ion conductor. Unlike the conventional structure of FIG. 18, in such an embodiment, the anode is confined, thus mobile ions cannot migrate to other portion of a larger anode layer. Further, in an erase operation (which reverses mobile ion travel away from the cathode), mobile ions can be collected back to the centrally located anode.

The embodiment of FIG. 2 shows a first electrode 204 with a cylindrical shape, a memory material 206 having an annular shape, and a second electrode 208 with a cylindrical opening. Such a configuration can allow for a substantially uniform electric field across the memory material 206. However, in alternate embodiments, such structures can have different shapes.

Figure 3:
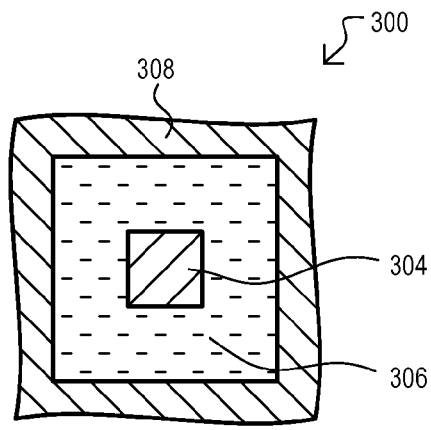
FIG. 3 is a top plan view of a memory element according to a further embodiment.

FIG. 3 shows a top plan view of a memory element 300 like that of FIG. 2, but with different electrode shapes. As in other embodiments, a first electrode 304 can be surrounded by memory material 306, which is surrounded by a second electrode 308 (all in the lateral direction). However, when viewed from the top, a first electrode 304 can have a square shape and an opening in a second electrode 308 can also have a square shape. FIG. 3 is provided to show but one of many possible variations in the shapes of a first electrode, second electrode, and memory material. That is, alternate embodiments can have shapes different from those of FIG. 2.

Figure 4A:
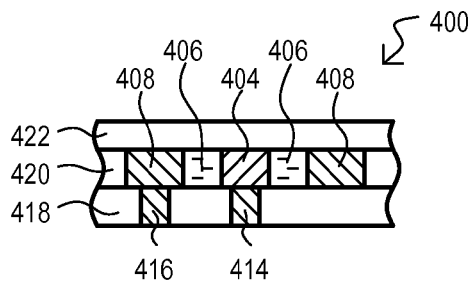
FIGS. 4A to 4C are a series of views showing a memory element according to another embodiment.
Figure 4B:
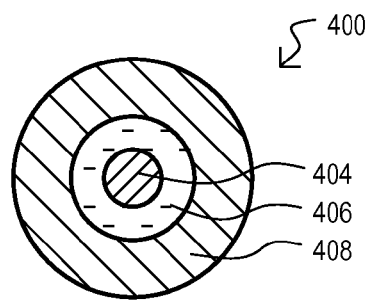
Figure 4C:
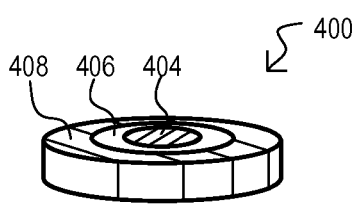

FIGS. 4A to 4C show a memory element 400 according to another embodiment. FIG. 4A is a side cross sectional view. FIG. 4B is a top plan view. FIG. 4C is a perspective view. In one particular embodiment, FIG. 4A can be one particular implementation of that shown in FIG. 1.

Referring to FIG. 4A, like FIG. 1, a memory element 400 can include a first electrode 404 surrounded by a memory material 406, and a second electrode 408 that surrounds the memory material 406 (in a lateral direction).

FIG. 4A differs from FIG. 1 in that it shows a first connection 414 and a second connection 416. A first connection 414 can form a vertical conductive path to first electrode 404 through a first insulating layer 418. A first connection 414 can be a contact or "via" type structure that can electrically connect first electrode 404 to a substrate or lower wiring layer. In one very particular embodiment, a first connection 414 can be a tungsten plug.

A second connection 416 can form another vertical conductive path through first insulating layer 418, but to second electrode 408. A second connection 416 can take any of the forms noted for the first connection 414, or equivalents.

FIG. 4A also differs from FIG. 1 in that it shows first electrode 404, memory material 406, and second electrode 408 formed in a second insulating layer 420. Further, a third insulating layer 422 is shown formed over first electrode 404, memory material 406, and second electrode 408.

It is noted that a structure like that shown in FIG. 4A is in contrast to a conventional approach like that of FIG. 18, in that there can be no top connections to memory element 400. Consequently, a memory device including such memory elements may not require a wiring layer over the memory elements. This can enable a memory element 400 to be more compatible with some existing manufacturing processes. Further, unlike FIG. 18, the absence of a top contact structure to the memory element can result in a more planar structure. Such a lack of topography can add to reliability in a device as there can be fewer weak points for mobile species to diffuse into, less mechanical stress and/or less concern for step coverage in the event metallization layers are formed over the memory element 400.

As shown in FIGS. 4B and 4C, in the very particular embodiment shown, a first electrode 404 can have a cylindrical shape, memory material 406 can have an annular shape, and second electrode 408 can also have an annular shape.

It is understood that in alternate embodiments, electrodes can have different shapes.

Figure 5:
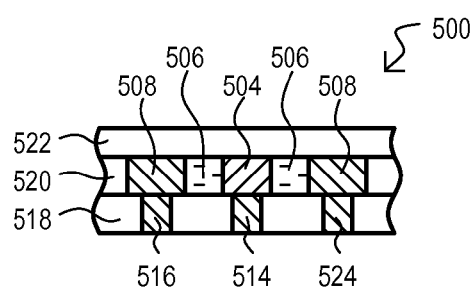
FIG. 5 is a side cross sectional view of a memory element according to an embodiment.

FIG. 5 shows a memory element 500 according to a further embodiment in a side cross sectional view. A memory element 500 can include sections like those of FIG. 4A. FIG. 5 differs from FIG. 4A in that is shows a third connection 524 in addition to first and second connections (514 and 516). A third connection 524, like second connection 516, can form a second vertical conductive path through first insulating layer 518 to second electrode 408. A third connection 524 can take any of the forms noted for the first connection 414 of FIG. 4A, or equivalents.

The memory element 500 of FIG. 5 can have a planar surface like that of FIG. 4A.

Figure 6:
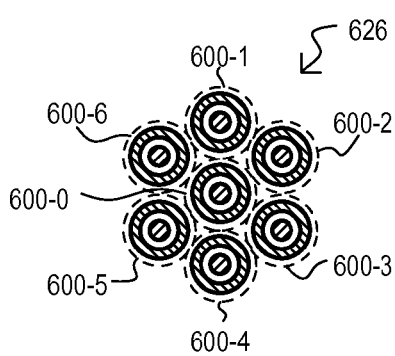
FIG. 6 is a top plan view showing a grouping or memory elements according to an embodiment.

FIG. 6 shows a group of memory elements 626 according to an embodiment. A group of memory elements can include a center memory element surrounded by multiple other memory elements. In the very particular embodiment shown, a group of memory elements 626 can include a center memory element 600-0 and six surrounding memory elements 600-1 to 600-6. In the embodiment shown, surrounding memory elements (600-1 to 600-6) can be arranged in radial fashion around the center memory element 600-0.

It is understood that while FIG. 6 shows six surrounding elements, other configurations can include a larger or smaller number of surrounding elements. Further, while FIG. 6 shows electrodes and a memory material having a circular shape, other embodiments can have differently shaped electrodes and memory material.

While embodiments like those of FIGS. 4B and 6 show elements with separate second electrodes, other embodiments can include a contiguous second electrode shared by multiple memory elements. One such embodiment is shown in FIGS. 7A and 7B.

Figure 7A:
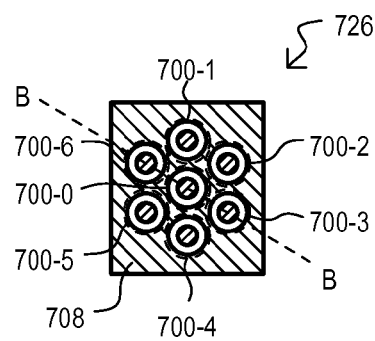
FIGS. 7A and 7B are views showing a grouping or memory elements having a common electrode according to embodiments.

FIG. 7A is a top plan view of a memory element group 726 according to an embodiment. A memory element group 726 can include items like that of FIG. 6, including a center memory element 700-0 and surrounding memory elements 700-1 to 700-6. However, unlike FIG. 6, a second electrode 708 can be shared among all the memory elements 700-0 to 700-6.

Figure 7B:
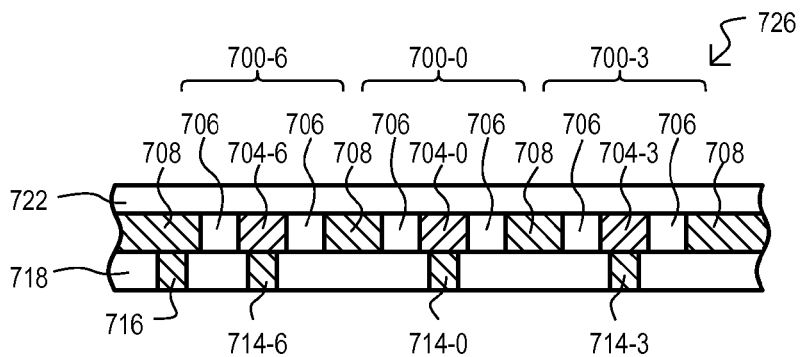

FIG. 7B is a side cross sectional view taken along line B-B of FIG. 7A. FIG. 7B shows memory elements 700-0, 700-3 and 700-6. Each memory element (700-0, 700-3 and 700-6) can include its own first electrode (704-0, 704-3 and 704-6). However, it is understood that second electrode 708 can be a contiguous structure separated from each first electrode (704-0, 704-3 and 704-6) by memory material 706.

In the embodiment shown, each first electrode (704-0, 704-3 and 704-6) can have its own vertical connection 714-0, 714-3, 714-6 that extends through a first insulating layer 718. Second electrode 708 can also have a vertical connection 716 that extends through first insulating layer 718.

The group of memory elements 726 shown in FIG. 7B can have a planar top surface like that of FIG. 4A.

FIG. 8 shows a memory element 800 according to another embodiment in a side cross sectional view.

Referring to FIG. 8, like FIG. 1, a memory element 800 can include a first electrode 804 surrounded by a memory material 806, and a second electrode 808 that surrounds the memory material 806 (in a lateral direction).

FIG. 8 differs from FIG. 1 in that a first electrode side surface 810 can have a sloped profile. In addition or alternatively, a second electrode side surface 811 can also have a sloped profile.

FIG. 9 shows a memory element 900 according to yet another embodiment in a side cross sectional view. Like FIG. 1, a memory element 900 can include a first electrode 904 surrounded by a memory material 906, and a second electrode 908 that surrounds the memory material 906 (in a lateral direction).

FIG. 9 differs from FIG. 1 in that an intervening layer 930 can be formed between the first electrode 904 and the memory material 906. In some embodiments, an intervening layer 930 can be an insulating layer, while in other embodiments an intervening layer 930 can be a conductive layer. An intervening layer 930 can be a deposited layer, or can be formed by treating an exposed surface of first electrode 904.

In one particular embodiment, a memory material 906 can include an ion conductor and an intervening layer can decrease a rate at which ions can conduct from first electrode 904. In addition or alternatively, an intervening layer 904 can be included to increase a resistance between first and electrodes (904 and 908) beyond that achievable with a memory layer 906.

In addition or alternatively, a memory element 900 can include an intervening layer 928 between a second electrode 908 and memory material 906. Such an intervening layer 928 can be subject to the same variations noted for intervening layer 930.

FIG. 10 shows a memory device 1032 according to an embodiment. A memory device 1032 can include a memory element 1000, a first connection 1014, a second connection 1016, and an access device 1034. A memory element 1000 can take the form of any of those shown herein or equivalents. In the embodiment shown, a memory element 1000 can be formed in an insulating layer 1020, and can have an insulating layer 1022 formed over its top surface.

A first connection 1014 can provide a conductive path from an electrode within memory element 1000 to access device 1034. In the embodiment shown, first connection 1014 can extend through interlayer dielectrics 1018-0 to -2 to a substrate 1002. It is understood that a first connection 1014 can be single contact structure, or can be formed of multiple structures (vias, landings, etc.).

A second connection 1016 can provide a conductive path to a wiring layer 1036. In the embodiment shown, second connection 1016 can extend through interlayer dielectric 1018-0 to wiring layer 1036. As in the case of first connection 1014, second connection 1016 can be single contact structure, or can be formed of multiple structures.

An access device 1034 can enable access to memory element 1000 for read and/or write (e.g., program/erase) operations. While the embodiment of FIG. 10 shows a transistor, an access device 1034 can be any suitable device including but not limited to: a transistor, diode, thyristor like device. Further, while FIG. 10 shows an access device formed in a substrate, other embodiments can include access devices formed above a substrate, such as a thin film type device.

It is understood that while FIG. 10 shows a memory element 1000 accessible by an access device 1034, alternate embodiments can have different configurations. As but one example, memory elements (e.g., 1000) can be deployed in a "crossbar" type configuration, having their electrodes connected to conductive lines arranged in different directions. In very particular crossbar configurations, a device may be added in series with the memory element, such as a diode, as but one example.

FIG. 11 shows a memory device 1132 according another embodiment. A memory device 1132 can include multiple memory elements 1100-0 to -2 that overlap one another on different vertical levels. Memory elements (1100-0 to -2) can take the form of any of those shown herein or equivalents. In the embodiment shown, memory element 1100-1 can be formed at a first vertical level. Memory elements 1100-0 and 1100-2 can be formed at a second vertical level, above memory element 1100-1, and can overlap memory element 1100-1.

Memory device 1132 can also include first connections 1114-0 to -2 which can be connected to first electrodes within their respective memory elements. A second connection 1116 can be connected to a second electrode within memory element 1100-1. A second electrode of memory element 1100-1 can be connected to second electrodes of the other memory elements by way of inter-element connections 1138-0/1.

FIG. 12 is a top plan view of a memory device 1232 like that of FIG. 11. A memory device 1232 can include memory elements (1200-0 to -3), with memory element 1200-0 being formed below, and being overlapped by, memory elements 1200-1 to -3.

While embodiments can include structures and devices as described above, other embodiments can include methods of forming such structures and devices. Methods according to various embodiments will now be described with reference to flow diagrams and sequences of cross sectional views.

Figure 13A:
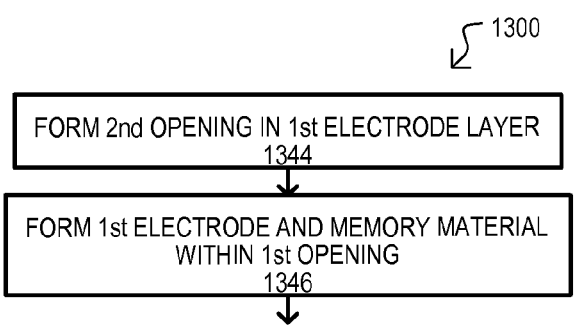
FIGS. 13A to 13C are diagrams showing a method according to an embodiment.
Figure 13B:
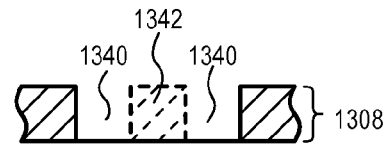
Figure 13C:
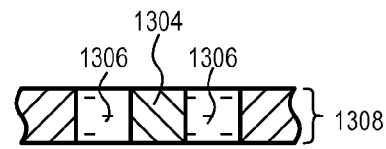

FIGS. 13A to 13C show a method 1300 according to an embodiment. FIG. 13A is a flow diagram. FIGS. 13B and 13C are side cross sectional views corresponding to the flow diagram of FIG. 13A.

Referring to FIG. 13A, a method 1300 can include forming a first opening in a second electrode layer (1344). FIG. 13B shows a memory element according to one embodiment following an action like that of 1344. An opening 1340 can be formed in second electrode layer 1308. Optionally, such an action can retain a sacrificial electrode material 1342. In one embodiment, a second electrode layer 1308 can be formed from a material suitable for a cathode, as described herein or equivalently.

Referring again to FIG. 13A, a method 1300 can also include forming a first electrode and memory layer within the first opening (1346). FIG. 13C shows a memory element according to one embodiment following an action like that of 1346. A first electrode 1304 and memory material 1306 can be formed in opening 1340. First electrode 1304 can be separated from a second electrode layer 1308 by memory material 1306. In one embodiment, a first electrode 1304 can be formed from a material suitable for an anode, as described herein or equivalently. A memory material 1308 can be an ion conducting material as described herein, or an equivalent.

Figure 14A:
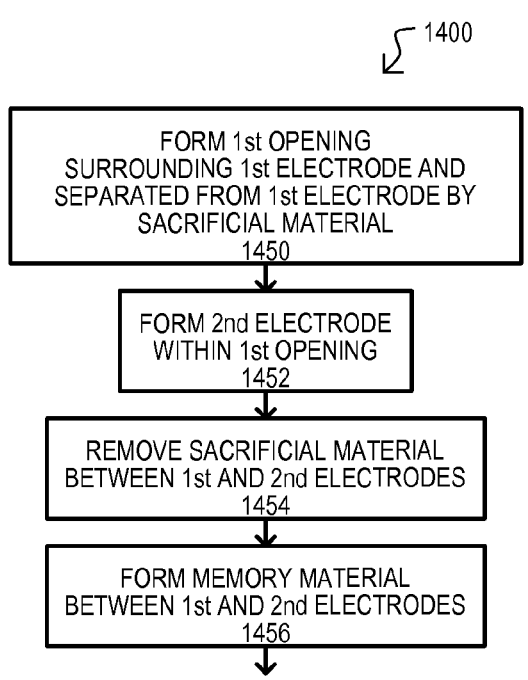
FIGS. 14A to 14E are diagrams showing a method according to another embodiment.

FIGS. 14A to 14E show a method 1400 according to another embodiment. FIG. 14A is a flow diagram. FIGS. 14B to 14E are side cross sectional views corresponding to the flow diagram of FIG. 14A.

Figure 14B:
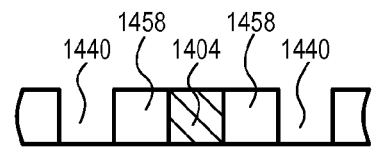

Referring to FIG. 14A, a method 1400 can include forming a first opening surrounding a first electrode, where the first opening is separated from the first electrode by a sacrificial material (1450). FIG. 14B shows a memory element according to one embodiment following an action like that of 1450. An opening 1440 can be formed, with a sacrificial material 1458 between the first electrode 1404 and the opening 1440. In one embodiment, a first electrode 1404 can be formed from a material suitable for an anode, as described herein or equivalently.

Figure 14C:
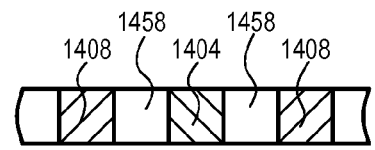

A method 1400 can also include forming a second electrode within the first opening (1452). FIG. 14C shows a memory element according to one embodiment following an action like that of 1452. A second electrode 1408 can be formed in opening 1440. In one embodiment, a second electrode layer 1408 can be formed from a material suitable for a cathode, as described herein or equivalently.

Figure 14D:
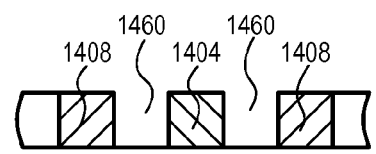

A method 1400 can further include removing the sacrificial material from between the first and second electrodes (1454). FIG. 14D shows a memory element according to one embodiment following an action like that of 1454. A sacrificial material 1458 can be removed resulting in a second opening 1460 being formed between first and second electrodes (1404 and 1408).

Figure 14E:
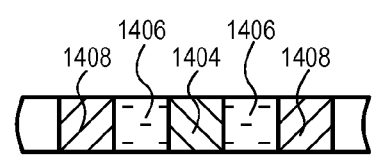

A method 1400 can form a memory material between the first and second electrodes (1456). FIG. 14E shows a memory element according to one embodiment following an action like that of 1456. A second electrode 1408 can be formed in second openings 1460.

Referring now to FIGS. 15A to 15G, a method according to another embodiment is shown in a series of side cross sectional views. In a particular embodiment, the method of FIGS. 15A to 15G can be one implementation of that shown in FIGS. 13A to 13C.

Figure 15A:
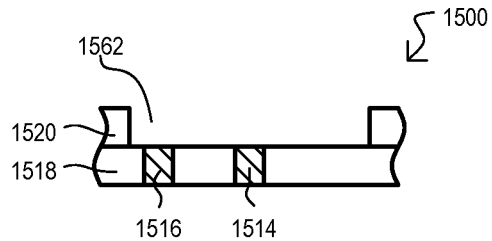
FIGS. 15A to 15G are a series of side cross sectional views showing a method of making a memory element according to an embodiment.

FIG. 15A shows the formation of an element opening 1562 in an insulating layer 1520. In the embodiment of FIG. 15A, element opening 1562 can expose a top surface of a first connection 1514 and a second connection 1516. First and second connections (1514 and 1516) can be formed through insulating layer 1518. In one embodiment, an element opening 1562 can define the extents of a resulting memory element.

Figure 15B:
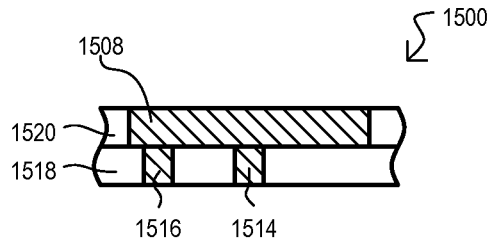

FIG. 15B shows the formation of a second electrode material 1508 within element opening 1562. In one embodiment, a second electrode material 1508 can be deposited into element opening 1562 and then planarized. In one particular embodiment, a second electrode material 1508 can include any material suitable for a cathode as described herein, or equivalents. Second electrode material 1508 can be in contact with first and second connections (1514 and 1516).

Figure 15C:
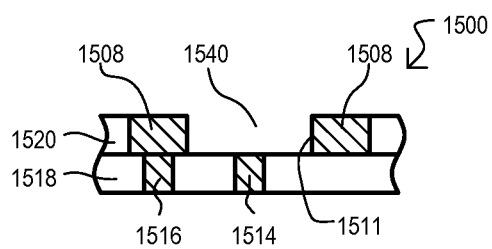

FIG. 15C shows the formation of a first opening 1540 within second electrode material 1508. A first opening 1540 can expose a top surface of first connection 1514. The creation of first opening 1540 can result in defining a shape of second electrode 1508. Second connection 1516 can remain in contact with second electrode 1508.

In one particular embodiment, a first opening 1540 can be formed with an etching step, more particularly, an anisotropic etching step. Such an etching can provide greater control in the smoothness of the second electrode surface 1511 (which will eventually be in contact with a memory material). This is in contrast to the conventional arrangement of FIG. 18, in which an ion conductor layer can be deposited on a cathode, the deposition processes determining the nature of the surface interface.

Figure 15D:
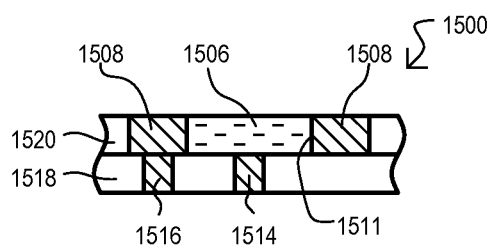

FIG. 15D shows the formation of a memory material 1506 in the first opening. In one embodiment, a memory material 1506 can be deposited into element opening 1562 and then planarized. In one particular embodiment, a memory material 1506 can include an ion conductor as described herein, or equivalents.

Figure 15E:
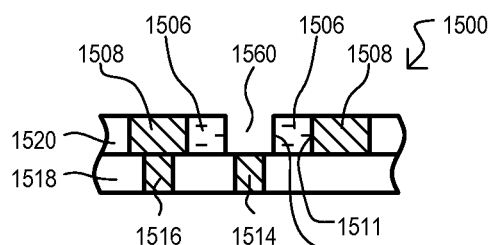

FIG. 15E shows the formation of a second opening 1560 within memory material 1508. A second opening 1560 can expose a top surface of first connection 1514. In one particular embodiment, a second opening 1560 can be formed with an etching step, more particularly, an anisotropic etching step. Like the first opening 1540, such an etching can provide greater control in the smoothness of the memory material surface 1510 (which will eventually be in contact with a first electrode). Again, this is contrast to an embodiment like that of FIG. 18, in which an anode layer can be deposited onto a top surface of an ion conductor layer.

Figure 15F:
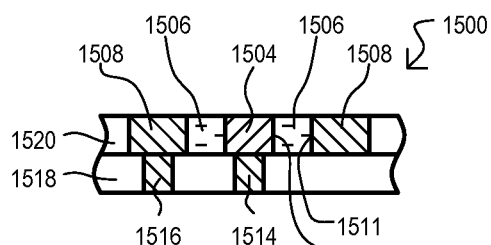

FIG. 15F shows the formation of a first electrode 1504 within second opening 1560. A first electrode material can be deposited into second opening 1560 and then planarized. In one particular embodiment, a first electrode 1504 can include any material suitable for an anode as described herein, or equivalents. First electrode 1504 can be in contact with first connection 1514.

Referring still to FIG. 15F, it is noted that a thickness of a memory material 1506 between first electrode 1504 and second electrode 1508 (in the lateral direction) can be established by etching (i.e., a patterning step). This is in contrast to a conventional approach like that of FIG. 18, in which the distance between the cathode and the anode (in the vertical direction) is established by a deposited thickness of an ion conductor layer.

Still further, an overall vertical thickness of a memory element 1500 can be controlled by a planarization step, such as chemical mechanical polishing (CMP). In one very particular embodiment, an insulating layer 1520 can serve as a CMP endpoint, allowing a memory element to be planarized to a top surface of insulating layer 1520.

Figure 15G:
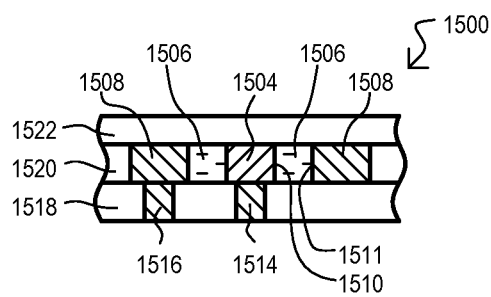

FIG. 15G shows the formation of a top insulating layer 1522 over the memory element 1500. As noted above, by use of connections (1514 and 1516) to bottom surfaces of electrodes, there may be no contacts to a top surface of a memory element 1500, to enable a planar surface, which can have advantages noted above.

Referring now to FIGS. 16A to 16G, a method according to another embodiment is shown in a series of side cross sectional views. In a particular embodiment, the method of FIGS. 16A to 16G can be one implementation of that shown in FIGS. 13A to 13C.

FIGS. 16A to 16G show a method in which a first electrode and memory material can be self-aligned to a second electrode.

Figure 16A:
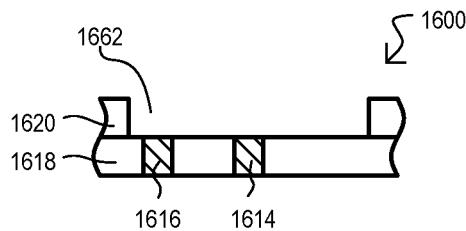
FIGS. 16A to 16G are a series of side cross sectional views showing a method of making a memory element according to another embodiment.
Figure 16B:
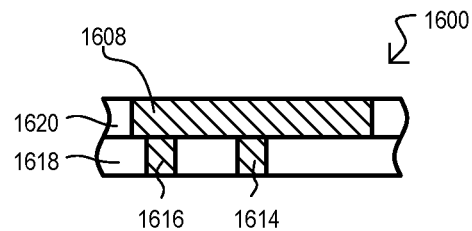

FIGS. 16A and 16B show actions like those of FIGS. 15A and 15B, and can be subject to the same variations noted for FIGS. 15A and 15B.

Figure 16C:
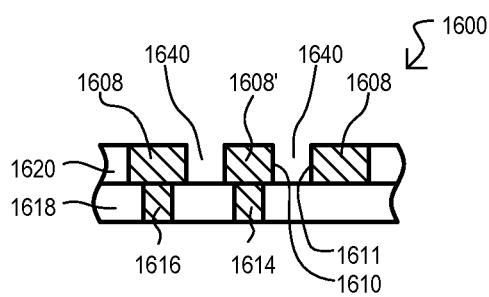

FIG. 16C shows the formation of a first opening 1640 within second electrode material 1608. A first opening 1640 can correspond to a desired location of a memory material. In one particular embodiment, a first opening 1640 can be formed with an etching step for smooth side surfaces (1610 and 1611) as noted in conjunction with FIG. 15C.

Referring still to FIG. 16C, formation of a first opening 1640 can result in a sacrificial portion 1608' of a second electrode. A sacrificial portion 1608' can correspond to a desired location of a first electrode.

Figure 16D:
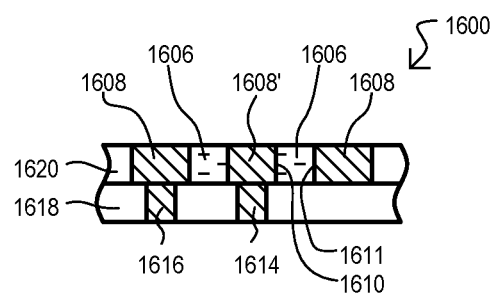

FIG. 16D shows the formation of a memory material 1606 in the first opening. Memory material 1606 can thus be self-aligned to second electrode 1608. In one embodiment, a memory material 1608 can be deposited into first opening 1640 and then planarized. In particular embodiments, a memory material 1606 can include an ion conductor as described herein, or equivalents.

Figure 16E:
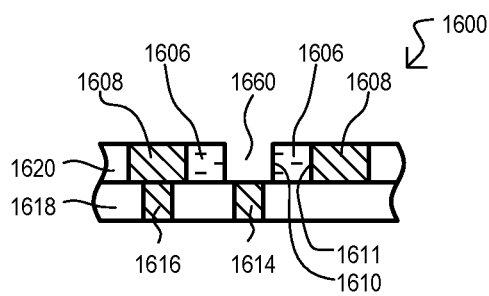

FIG. 16E shows the removal of sacrificial portion 1608' to form a second opening 1660. A second opening 1660 can expose a top surface of first connection 1614. In one particular embodiment, removal of sacrificial portion 1608' can include a wet chemical etch.

Figure 16F:
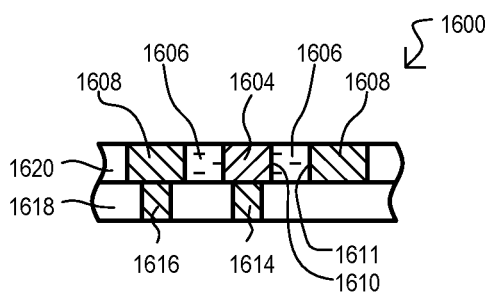
Figure 16G:
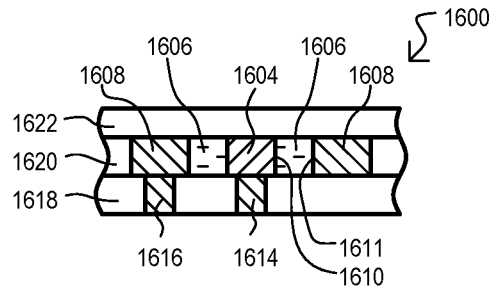

FIGS. 16F and 16G shows actions like those of FIGS. 15F and 15G, and can be subject to the same variations noted for FIGS. 15F/G. It is noted that because a first electrode 1604 is formed in the place of sacrificial portion 1608', the first electrode 1604 is also self-aligned to the second electrode 1608.

As in the case of FIGS. 15A to 15G, a resulting memory element 1600 can have a memory material thickness between electrodes that can be determined by a patterning step. Also, a resulting memory element structure can have a planar top surface.

Self alignment between a first electrode (e.g., 1604) and second electrode (e.g., 1608) can help ensure substantially even electric field regions between the electrodes. In other embodiments, it is possible that there can be some misalignment between electrodes, leading to high electric field areas. In such cases, a filament can preferentially grow in the high field areas. This may not affect growth of the filament, but after a number of cycles, it may make dissolution of the filament harder to accomplish as compared to a no misalignment case.

Referring now to FIGS. 17A to 17I, a method according to a further embodiment is shown in a series of side cross sectional views. In a particular embodiment, the method of FIGS. 17A to 17I can be one implementation of that shown in FIGS. 14A to 14E.

FIGS. 17A to 17I show a method in which positions of a memory material and a second electrode can be aligned to a first electrode position.

Figure 17A:
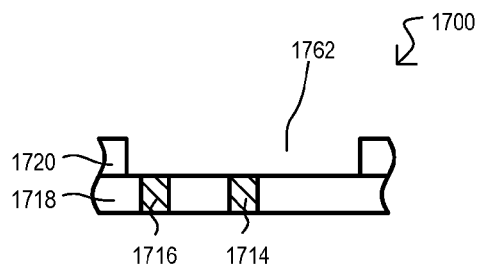
FIGS. 17A to 17I are a series of side cross sectional views showing a method of making a memory element according to a further embodiment.

FIG. 17A shows actions like those of FIG. 15A, and can be subject to the same variations noted for FIG. 15A.

Figure 17B:
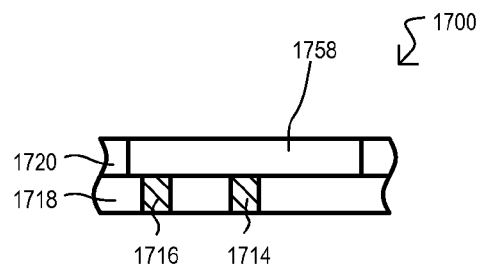

FIG. 17B shows the formation of a sacrificial material 1758 within element opening 1762. In one embodiment, a sacrificial material 1758 can be deposited into element opening 1762 and then planarized. In one particular embodiment, a sacrificial material 1758 can include a material suitable for patterning desired positions of electrodes and a memory material. In a very particular embodiment, a sacrificial material 1758 can be an insulating layer, such as that utilized as an inter-layer dielectric, including but not limited to: silicon dioxide, silicon oxynitride, silicon oxyhydride, silicon nitride, as but as few examples.

Figure 17C:
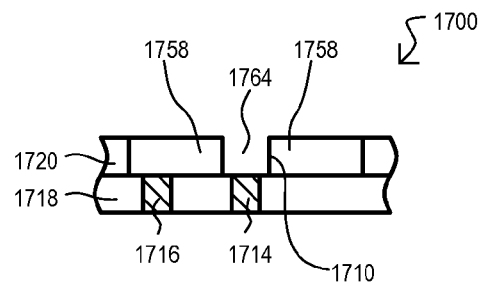

FIG. 17C shows the formation of an electrode opening 1764 in sacrificial material 1758. In the embodiment of FIG. 17C, electrode opening 1764 can expose a top surface of a first connection 1714. In one particular embodiment, an electrode opening 1764 can be formed with an etching step, more particularly, an anisotropic etching step. As in the embodiment of FIGS. 15A to 15G, such an etching can provide greater control in the smoothness of a first electrode surface 1710 that will contact a memory material.

Figure 17D:
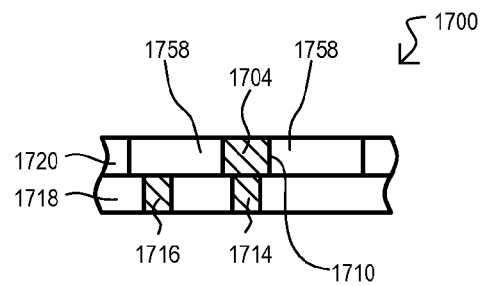

FIG. 17D shows the formation of a first electrode 1704 within electrode opening 1764. A first electrode material can be deposited into electrode opening 1764 and then planarized. In one particular embodiment, a first electrode 1704 can include any material suitable for an anode as described herein, or equivalents. First electrode 1704 can be in contact with first connection 1714.

Referring still to FIG. 17D, in some embodiments, a first electrode 1704 can be formed from one or more metals. After being formed, a memory element 1700 can be subject to an anneal step that can increase grain sizes within a first electrode 1704 prior to the formation of memory material. Such larger grain sizes may contribute to more reliable memory element performance.

More particularly, a method like that of FIGS. 17A to 17I may be particularly useful when such memory elements are embedded into an integrated circuit device relatively early in a fabrication sequence. Conventionally, subsequent heat cycles may cause significant growth in grain sizes of an electrode material, which can adversely affect reliability and performance (e.g., electrode grains may short through a dielectric or form very high field areas, etc.). In contrast, in an embodiment like that of FIG. 17A to 17I, grain sizes may be grown early, the process, and hence only experience diminished growth in due to subsequent heat cycles.

Figure 17E:
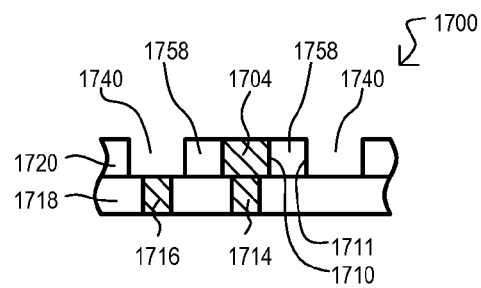

FIG. 17E shows the formation of a first opening 1740 within sacrificial material 1758. Such a first opening 1740 can be aligned to a position of first electrode 1704. First opening 1740 can define a location of a second electrode (and hence also the position of memory material between such electrodes). A first opening 1740 can expose a top surface of second connection 1710.

Figure 17F:
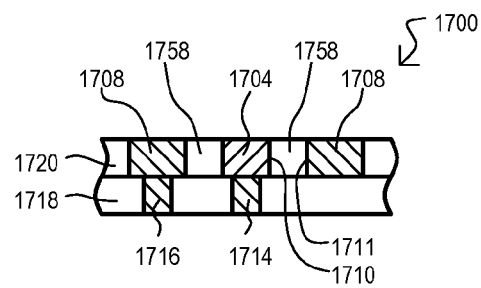

FIG. 17F shows the formation of a second electrode 1708 within first opening 1740. In one embodiment, a second electrode material can be deposited into first opening 1740 and then planarized. In one particular embodiment, a second electrode material can include any material suitable for a cathode as described herein, or equivalents. Second electrode material 1708 can be in contact with second connection 1716.

Figure 17G:
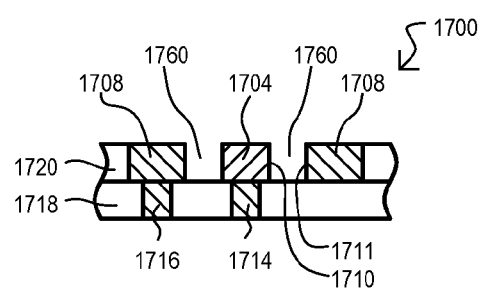

FIG. 17G shows the formation of a second opening 1760 by removing sacrificial material 1758 between first electrode 1704 and second electrode 1708. A second opening 1760 can correspond to a desired location for memory material.

Figure 17H:
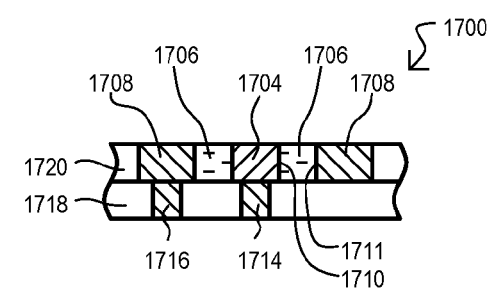

FIG. 17H shows the formation of a memory material 1706 in the second opening. As in the case of FIGS. 15A to 15G, a memory material 1706 can be deposited into second opening 1760 and then planarized.

Figure 17I:
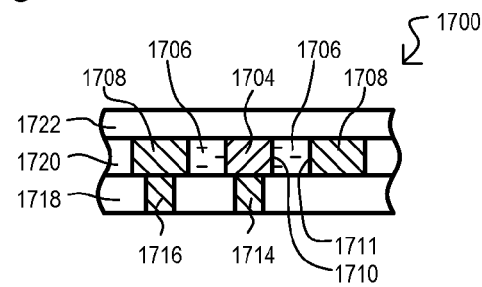

FIG. 17I shows actions like those of FIG. 15G, and can be subject to the same variations noted for FIG. 15G.

As in the case of FIGS. 15A to 15G, a resulting memory element 1700 can have a memory material thickness determined by a patterning step, as well as a planar top surface.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of memory elements, each including
first electrode enclosed by a side surface in a lateral direction;
a memory material surrounding the first electrode side surface in the lateral direction, the memory material being programmable between at least two different impedance states in response to electric fields; and
a second electrode formed around the memory material in the lateral direction; wherein
the memory elements are organized into groups of multiple memory elements, each group including a center element, and a plurality of surrounding elements, each surrounding element being positioned at a different radial position around the center element, and the number of surrounding elements is no less than three, and
the second electrode of each memory element in a group is a contiguous structure formed around the memory material of all memory elements in the group.

2. The memory device of claim 1, wherein:
the memory material comprises at least one ion conducting material; and
the first electrode is an anode comprising at least one element that ion conducts in the ion conducting material.

3. The memory device of claim 2, wherein:
the second electrode completely surrounds the memory material in the lateral direction; wherein
the first and second electrodes are configured to apply a substantially uniform field over all of the memory material in an erase operation to collect substantially all of the ion conducting element material back into the anode.

4. The memory device of claim 2, wherein:
the ion conducting material is selected from the group of: a chalcogenide and an oxide.

5. The memory device of claim 2, wherein:
the anode element that ion conducts in the ion conducting material is selected from the group of: silver and copper.

6. The memory device of claim 1, wherein:
the first electrode has the shape of a cylinder.

7. The memory device of claim 6, wherein:
the memory material has an annular shape.

8. The memory device of claim 1, wherein:
the number of surrounding elements is no less than four.

9. A method, comprising:
forming a first opening that surrounds, and is separated from, a first electrode by a sacrificial material;
forming a second electrode material in the first opening;
removing the sacrificial material between the first and second electrodes to create second openings; and
forming a memory material in the second openings that is programmable between at least two different impedance states in response to electric fields.

10. The method of claim 9, wherein:
the memory material comprises at least one ion conducting material; and
the first electrode is an anode comprising at least one element that ion conducts in the ion conducting material.

11. The method of claim 10, wherein:
the ion conducting material is selected from the group of: a chalcogenide and an oxide.

12. The method of claim 10, wherein:
the anode element that ion conducts in the ion conducting material is selected from the group of: silver and copper.

13. The method of claim 9, further including:
before forming the opening
forming an electrode opening in a sacrificial material layer, and
forming a first electrode material in the electrode opening to form the first electrode.

14. The method of claim 13, further including:
the first electrode material comprises a material having crystal grains; and
annealing to increase the size of the crystal grains.

15. The method of claim 9, further including:
before forming the opening
forming an element opening in an insulating layer; and
forming the sacrificial material in the element opening.

* * * * *